United States Patent [19]

Murakami et al.

[11] Patent Number: 5,312,776
[45] Date of Patent: May 17, 1994

[54] METHOD OF PREVENTING THE CORROSION OF METALLIC WIRINGS

[75] Inventors: Tomoyasu Murakami; Michinari Yamanaka; Kousaku Yano; Masayuki Endo; Noboru Nomura; Staoshi Ueda; Naoto Matsuo, all of Osaka; Hiroshi Imai, Kyoto; Masafumi Kubota, Osaka, all of Japan

[73] Assignee: Matsushita Electric Industrial Co., Ltd., Osaka, Japan

[21] Appl. No.: 977,022

[22] Filed: Nov. 16, 1992

[30] Foreign Application Priority Data

Nov. 18, 1991 [JP] Japan .................. 3-301652

[51] Int. Cl.⁵ .............................. H01L 71/44
[52] U.S. Cl. .................... 437/194; 437/187; 437/188; 437/197; 427/126.4; 148/279; 148/DIG. 131
[58] Field of Search ............... 437/194, 195, 187, 188, 437/197, 200; 148/275, 279, DIG. 131; 427/96, 97, 99, 126.4

[56] References Cited

U.S. PATENT DOCUMENTS

| | | | |
|---|---|---|---|
| 4,097,889 | 6/1978 | Kern et al. | 437/194 |
| 4,585,571 | 4/1986 | Bloom . | |
| 4,938,993 | 7/1990 | Bennett | 148/279 |
| 4,988,423 | 1/1991 | Yamamoto et al. | 437/194 |
| 5,196,372 | 3/1993 | Mikoshiba et al. | 437/194 |
| 5,202,291 | 4/1993 | Charvat et al. | 214/DIG. 131 |

FOREIGN PATENT DOCUMENTS 61-222136 10/1986 Japan .
2-113523 4/1990 Japan .

*Primary Examiner*—Brian E. Hearn
*Assistant Examiner*—Kevin M. Picardat
*Attorney, Agent, or Firm*—Willian Brinks Olds Hofer Gilson & Lione

[57] ABSTRACT

According to the method of preventing the corrosion of metallic wirings of the present invention, aluminium alloy wirings are formed on the surface of a substrate with the use of photoresists, and the photoresists are then removed. Thereafter, HMDS (hexamethyl disilazine) serving as a surface-active agent or its derivative is supplied to the aluminium alloy wirings to form hydrophobic molecular layers on the lateral walls of the aluminium alloy wirings.

9 Claims, 8 Drawing Sheets

40 μm

40 μm

METHOD OF PREVENTING THE CORROSION OF METALLIC WIRINGS

BACKGROUND OF THE INVENTION

The present invention relates to a method of preventing the corrosion of metallic wirings for LSIs or the like formed on the surface of a substrate.

As the material of metallic wirings for LSIs or the like, there may be used a single-layer film comprising aluminium., refractory metal (titanium, titanium nitride, tungusten, titanium tungusten) or an aluminium alloy (containing about 1% of silicon and about 0.5% of copper), or a multi-layer film comprising an aluminium alloy and refractory metal.

Such metallic wirings are formed by etching a metallic film formed on a silicon oxide, for example, a metallic film containing aluminium, with chlorine-containing gas such as $BCl_3$, $SiCl_4$, $Cl_2$ or $CHCl_3$. The reason why the chlorine-containing gas is used, is because an aluminium chloride ($AlCl_3$) which is a compound of aluminium and chlorine, presents the highest vapor pressure among compounds of aluminium with fluorine, chlorine, bromine, iodine or the like.

FIGS. 7 (a) to (c) show conventional dry-etching steps with an aluminium alloy used as the material of metallic wirings.

As shown in FIG. 7 (a), a silicon oxide film containing boron and phosphorus (hereinafter referred to as BPSG film) 2 is formed on a substrate 1, an aluminium alloy film 3 is then formed on the BPSG film 2 and photoresists 4 are then formed on the aluminium alloy film 3. More specifically, the BPSG film 2 is deposited by a thickness of 700 nm on the substrate 1 by a chemical vapor deposition method (hereinafter referred to as CVD method). Then, there is deposited, by a thickness of 800 nm, the aluminium alloy film 3 comprising an aluminium alloy containing 1% of silicon and 0.5% of copper (hereinafter referred to as Al-Si(1%)-Cu(0.5%)) by a sputtering method. Applied to the aluminium alloy film 3 is a resist film, which is then subjected to photolithography to form the photoresists 4 in a desired pattern.

As shown in FIG. 7 (b), with the photoresists 4 serving as masks, the aluminium alloy film 3 is etched by a reactive ion etching method with the use of chlorine-containing gas such as $SiCl_4$, $Cl_2$, $CHCl_3$ or the like, thus forming aluminium alloy wirings 5 in a desired pattern. At this time, a great amount of chlorine-containing substances 6 comprising residual chlorine and a chloride such as $AlCl_3$ and the like, sticks to the lateral walls of the photoresists 4 and the aluminium alloy wirings 5. If the substrate 1 is taken out in the air with no surface treatment applied to the aluminium alloy wirings 5 after completion of the etching, there is a likelihood that the chlorine-containing substances 6 sticking to the photoresists 4 and the aluminium alloy wirings 5 are reacted with water content in the air to cause the aluminium alloy wirings 5 to be corroded. Such corrosion may result in serious troubles such as disconnection of the aluminium alloy wirings and decreased reliability of the semiconductor devices.

In a conventional method, upon completion of the etching of the aluminium alloy film 3, the substrate 1 has been conveyed into another chamber without the aluminium alloy wirings 5 exposed to the air. After the photoresists 4 to which a great amount of residual chlorine and a chloride sticks, and major portions of the chlorine-containing substances 6 sticking to the lateral walls of the aluminium alloy wirings 5, had been removed by oxygen plasma in the chamber above-mentioned, the substrate 1 has been taken out in the air, as shown in FIG. 7 (c).

In the method using the oxygen plasma above-mentioned, however, the corrosion of the aluminium alloy wirings has not been perfectly prevented. More specifically, according to the method using the oxygen plasma, the photoresists 4 and a major portion of the chlorine-containing substance 6 sticking to the surface of the substrate 1 have been removed, but chlorine atoms entered in the grain boundary of the aluminium alloy wirings 5 could not been removed and have reacted with water content in the air.

SUMMARY OF THE INVENTION

To overcome the problems above-mentioned, the present invention is proposed with the object of providing a method of preventing the corrosion of metallic wirings, even though the metallic wirings are exposed in the air after a metallic film mainly containing, for example, aluminium has been etched to form the metallic wirings, or after photoresists have been removed after the metallic wirings had been formed.

To achieve the object above-mentioned, the method of preventing the corrosion of metallic wirings of the present invention comprises a first step of forming a metallic film on silicon oxide, a second step of dry-etching the metallic film with chlorine-containing gas to form, in a desired pattern, metallic wirings made of the metallic film, and a third step of supplying a surface-active agent or its derivative to the metallic wirings to form hydrophobic molecular layers on the lateral walls of the metallic wirings.

When the present invention is applied to the case where the metallic film is a single-layer film mainly containing aluminium or a multi-layer film including a layer mainly containing aluminium and a layer of other metal than aluminium, the metallic wirings can be securely prevented from being corroded even though the metallic film is a single-layer film mainly containing aluminium liable to be corroded particularly by chlorine-containing gas, or a multi-layer film including a layer mainly containing aluminium and a layer of other metal than aluminium.

Even though the hydrophobic molecular layers are formed on the lateral walls of the metallic wirings, a harmful influence by the formation of the molecular layers is hardly exerted when a surface-active agent or its derivative containing silicon or germanium is used as the surface-active agent or its derivative above-mentioned.

When there is used a derivative of a surface-active agent which is reacted with functional groups present on the surfaces of the metallic wirings to form hydrophobic molecular layers on the lateral walls of the metallic wirings, the molecular layers strongly stick to the metallic wirings, thus producing an excellent effect of preventing the metallic wirings from being corroded.

As the surface-active agent or its derivative, there is preferably used any of a silane compound, a siloxane compound, a disilazine compound, a trisilazine compound, a piperazine compound, an amino germanium compound and a germanium halide compound.

When the surface-active agent or its derivative is used in the form of gas, few additional installation is required, thus enabling to prevent the corrosion of metallic wirings in a simple manner.

When the second and third steps are carried out in the same apparatus under vacuum or in an atmosphere containing no water content, the substrate for which the second step has been complete, does not come in contact with water content, thus preventing the chloride from being reacted with water content. Further, this eliminates a step of conveying the substrate for which the second step has been complete.

DETAILED DESCRIPTION OF THE INVENTION

Figure 8A:
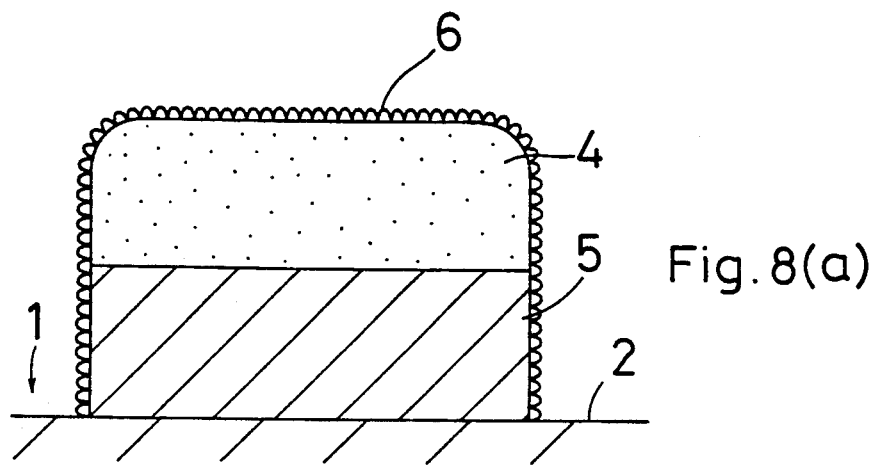
FIGS. 8 (a) to (c) are schematic views illustrating the mechanism that aluminium alloy wirings are corroded.
Figure 8B:
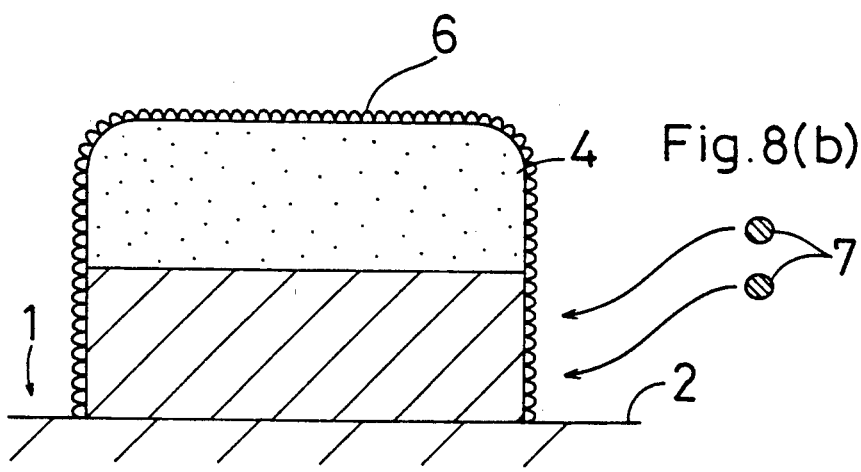
Figure 8C:
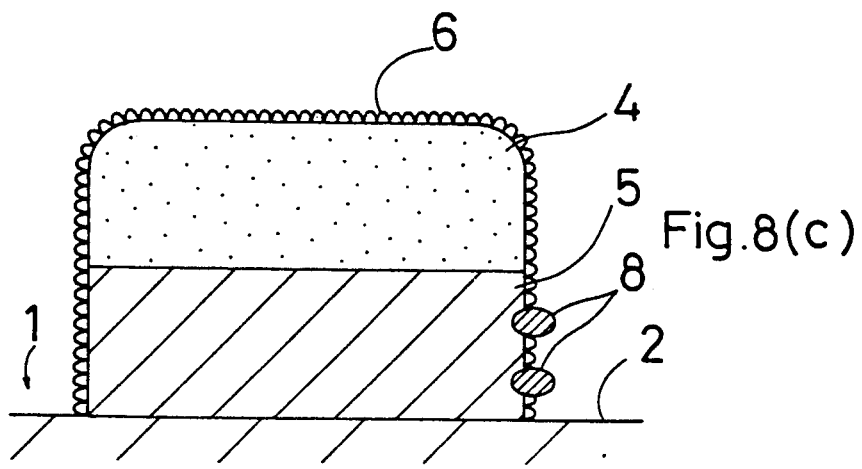

Before the present invention is discussed, the following will discuss the mechanism that metallic wirings are corroded, with reference to FIG. 8.

LSI wirings, i.e., metallic wirings each comprising a single-layer film of an aluminium alloy or the like or a multi-layer film of an aluminium alloy and other metal than aluminium, are corroded basically due to a reaction between water content in the air and residual chlorine & a chloride resulting from chlorine-containing gas used in dry-etching.

As shown in FIG. 8 (a), a silicon oxide film 1a is formed on the surface of a substrate 1, and an aluminium alloy wiring 5 is formed on the silicon oxide film 1a by dry-etching with chlorine-containing gas. A chlorine-containing substance 6 comprising residual chlorine and a chloride resulting from the chlorine-containing gas used in the dry-etching, sticks to the surfaces of the aluminium alloy wiring 5 and a photoresist 4 used for forming the aluminium alloy wiring 5.

When the substrate with silicon oxide on which the aluminium alloy wiring 5 is formed, is taken out in the air, the chlorine-containing substance 6 sticking to the surface of the aluminium alloy wiring 5 is reacted with water content 7 in the air as shown in FIG. 8 (b). Thus, liquid drops 8 containing chlorine are formed as shown in FIG. 8 (c). Due to a reaction between the liquid drops 8 and aluminium in the aluminium alloy wiring 5, Al(OH)$_3$, AlCl$_x$(H$_2$O)$_y$ and the like are formed to cause the aluminium alloy wiring 5 to be corroded.

If impurities are contained in the aluminium alloy wiring 5, or if the aluminium alloy wiring 5 comprises a multi-layer film of an aluminium alloy and other metal than aluminium, local cells are formed between metals of different types through the liquid drops 8 containing chlorine. There are instances where the cell reaction accelerates the corrosion of the aluminium alloy wirings.

(First Embodiment)

The following description will discuss a first embodiment of the present invention with reference to FIGS. 1 (a) to (d).

In the first embodiment, aluminium alloy wirings 5 are used as wiring metal. According to the first embodiment, after the aluminium alloy wirings 5 are formed on the surface of a substrate 1, photoresists 4 are removed and a surface treatment is then carried out with HMDS (hexamethyl disilazine) serving as a surface-active agent or its derivative.

In the following, the first embodiment will be discussed in detail.

As shown in FIG. 1 (a), a BPSG film 2 having a thickness of 700 nm is formed on the surface of the substrate 1 by a CVD method. An aluminium alloy film 3 having a thickness of 800 nm containing 1% of Si and 0.5% of Cu, is formed on the surface of the BPSG film 2 by a sputtering method. A resist film is formed on the surface of the aluminium alloy film 3 and then subjected to a photolithography to form photoresists 4 in a desired pattern.

With the photoresists 4 serving as masks, the aluminium alloy film 3 is dry-etched by a reactive ion etching method under the following conditions shown in Table 1 with the use of a gas mixture of SiCl$_4$, Cl$_2$ and CHCl$_3$, thereby to form the aluminium alloy wirings 5 in a desired pattern, as shown in FIG. 1 (b). At this time, chlorine-containing substances 6 comprising residual chlorine and a chloride such as AlCl$_3$ or the like stick to the surfaces of the photoresists 4 and the aluminium alloy wirings 5.

TABLE 1

|  | SiCl$_4$ | Cl$_2$ | CHCl$_3$ | N$_2$ |
| --- | --- | --- | --- | --- |
| Gas Flow Amount (sccm) | 100 | 20 | 20 | 100 |
| Pressure (Pa) |  | 35 |  |  |
| RF Power (w) |  | 300 |  |  |

TABLE 1-continued

| | SiCl$_4$ | Cl$_2$ | CHCl$_3$ | N$_2$ |
|---|---|---|---|---|
| Time (second) | | | 180 | |

With provision made such that the aluminium alloy wirings 5 are not exposed to the air, the substrate 1 is moved to a reaction chamber, where the photoresists 4 are removed with the use of oxygen plasma as shown in FIG. 1 (c). Such a treatment with oxygen plasma removes major portions of the chlorine-containing substances 6, but parts thereof remain unremoved.

As shown in FIG. 1 (d), a treatment is carried out on the surfaces of the aluminium alloy wirings 5 with HMDS. Such a surface treatment with HMDS may be carried out in an etching chamber, a load lock chamber, other treating chamber than the etching chamber, or the like, where HMDS is to be introduced through a flow meter or a mass flow controller. It is preferable to carry out the surface treatment under the following conditions shown in Table 2 and under a partial pressure not greater than a saturated vapor pressure (25° C., 13 Torr).

TABLE 2

| Reaction Temperature | 130° C. |
|---|---|
| Flow Amount of HMDS | 5 sccm |
| Pressure | 1 atmospheric pressure |
| Reaction Time | 5 minutes |

HMDS is reacted with Al(OH)$_3$ or a hydroxyl group (OH group) sticking to the surface of the substrate 1 as shown in the following Chemical Formula 1. Thus formed on the surfaces of the aluminium alloy wirings 5 are hydrophobic films 9 each having a thickness of several angstroms to douzens of angstroms.

(Chemical Formula 1)

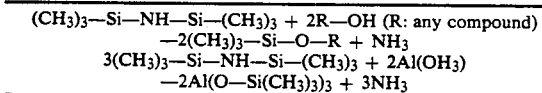

HMDS is readily reacted with hydroxyl groups on the surfaces of the aluminium alloy wirings 5 and the silicon oxide 2 at a room temperature, thereby to form hydrophobic films 9 each of which has a thickness of several angstroms to douzens of angstroms and each of which has a surface having a functional group of —O—Si(CH$_3$)$_3$. The chlorine-containing substances 6 remaining on the surfaces of the aluminium alloy wirings 5 are coated with the hydrophobic films 9. Accordingly, the chlorine-containing substances 6 are not reacted with water content in the air as shown in the following Chemical Formula 2, thus preventing the aluminium alloy wirings 5 from being corroded.

(Chemical Formula 2)

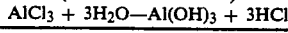

Figure 1A:
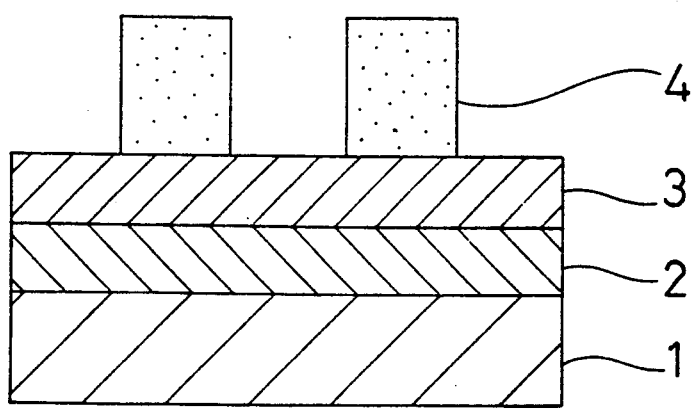
FIGS. 1 (a) to (d) are section views illustrating the respective steps of a method of preventing the corrosion of metallic wirings according to a first embodiment of the present invention.
Figure 1B:
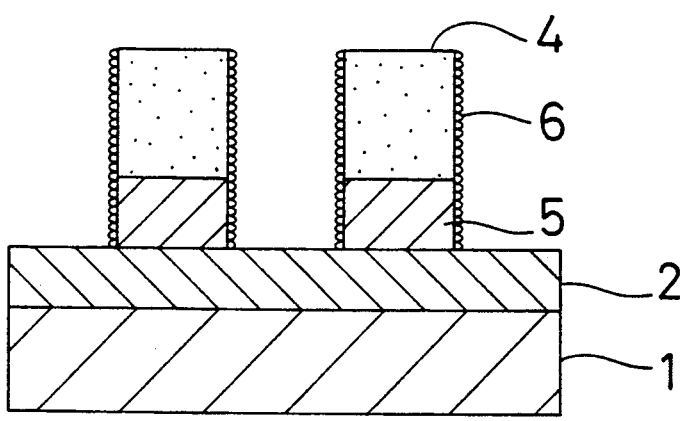
Figure 1C:
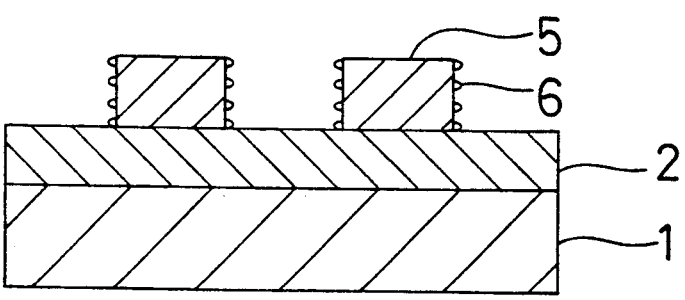
Figure 1D:
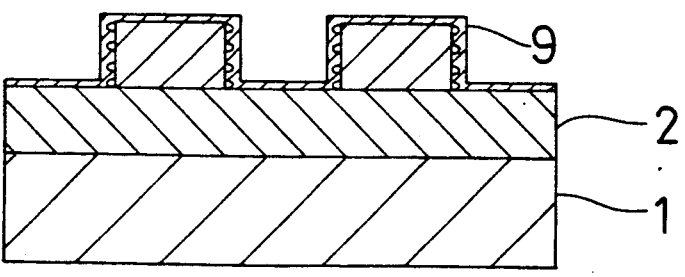
Figure 2A:
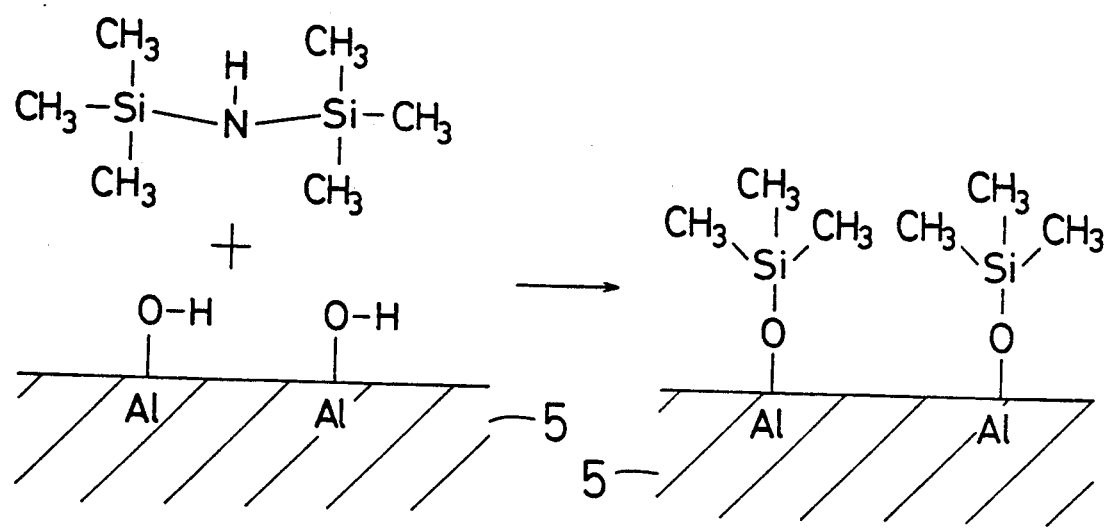
FIGS. 2 (a) and (b) are schematic views illustrating the concept of a reaction between the surface of an aluminium alloy wiring and hexamethyl disilazine (hereinafter referred to as HMDS), wherein (a) shows a reaction between HMDS and a hydroxyl group on the surface of the aluminium alloy wiring, and (b) shows a reaction between HMDS and an aluminium chloride on the surface of the aluminium alloy wiring.
Figure 2B:
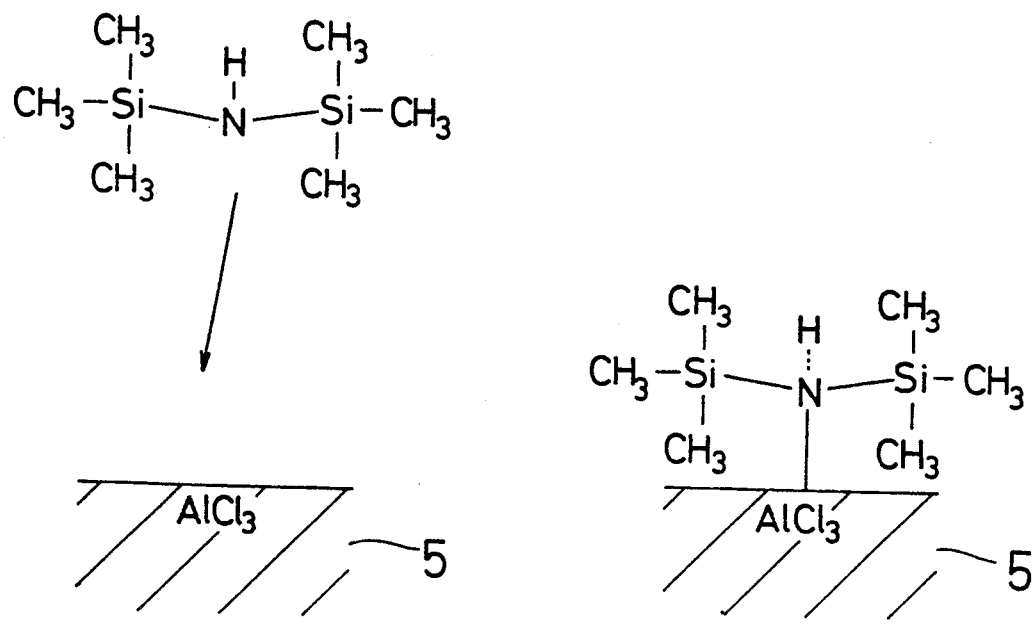

FIGS. 2 (a) and (b) show the concept of a reaction between HMDS and the surfaces of the aluminium alloy wirings 5. FIG. 2 (a) shows a reaction between HMDS and hydroxyl groups on the surfaces of the aluminium alloy wirings 5, as shown by Chemical Formula 1, while FIG. 2 (b) shows a reaction between HMDS and AlCl$_3$ as shown in the following Chemical Formula 3. Since HMDS is Lewis base and AlCl$_3$ is a strong Lewis acid, the reaction as shown by Chemical Formula 3 is carried out.

(Chemical Formula 3)

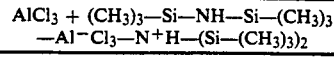

With the reactions above-mentioned, the surfaces of the aluminium alloy wirings 5 are coated with molecular layers where hydrophobic methyl groups of —Si—(CH$_3$)$_3$ are arranged, and the hydrophobic films 9 are formed on the surfaces of the aluminium alloy wirings 5. Such a treatment prevents the chlorine-containing substances 6 from being reacted with water content in the air to corrode the aluminium alloy wirings 5, even though the aluminium alloy wirings 5 are exposed to the air, the aluminium alloy wirings 5 having surfaces to which stick the chlorine-containing substances 6 comprising residual chlorine and chloride which could not be removed by the oxygen plasma treatment.

Figure 3:
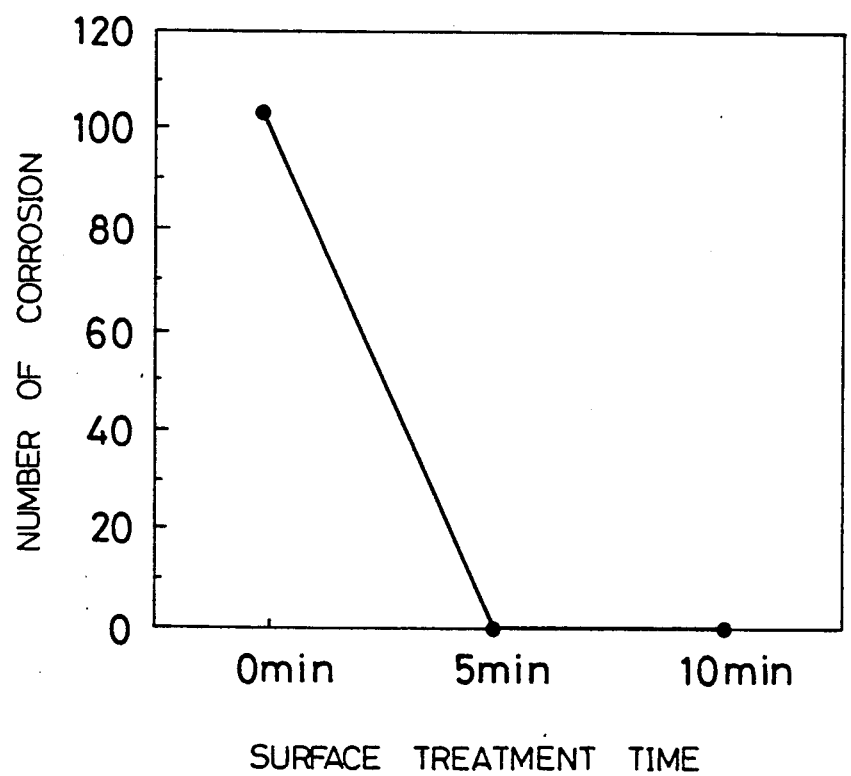
FIG. 3 is a view illustrating the corrosion preventive effect produced by a surface treatment with HMDS according to the method of the first embodiment.
Figure 4A:
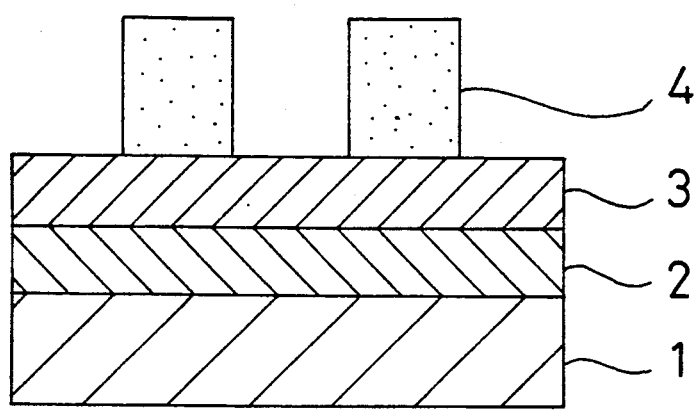
FIGS. 4 (a) to (d) are section views illustrating the respective steps of a method of preventing the corrosion of metallic wirings according to a second embodiment of the present invention.
Figure 4B:
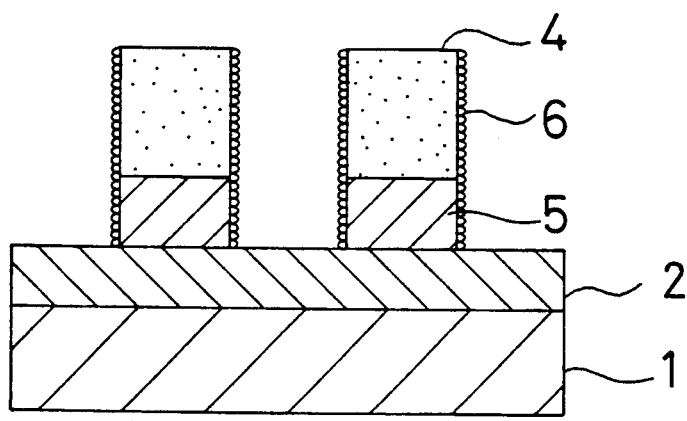
Figure 4C:
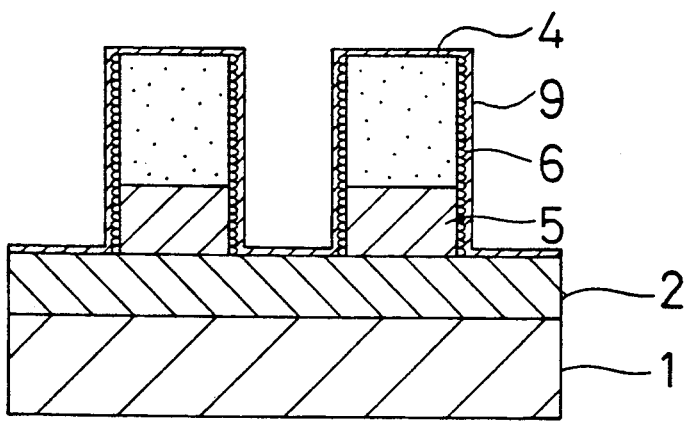
Figure 4D:
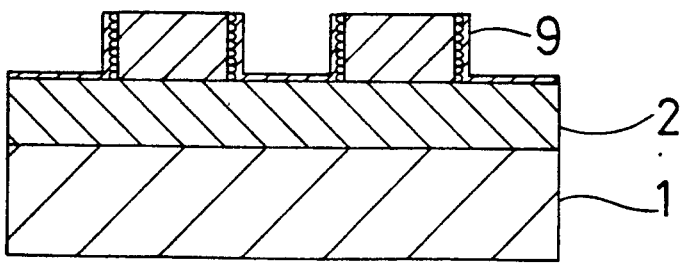

FIG. 3 shows the corrosion preventive effect produced by a surface treatment with HMDS. Samples used for making such evaluation were obtained in the following manner.

A film of Al-Si(1%)-Cu(0.5%) having a thickness of 0.7 μm formed on the silicon oxide film 1a was dry-etched using chlorine-containing gas, and the substrate 1 was then conveyed, under vacuum, to another reaction chamber, where the photoresists 4 were removed by oxygen plasma, thus preparing aluminium alloy wirings each having a width of 0.6 μm.

The aluminium alloy wirings were surface-treated with the use of HMDS for two different periods of time to prepare two different samples, and the aluminium alloy wirings were not surface-treated with the use of HMDS to prepare a sample. After left in the air for 48 hours, these samples thus prepared were compared as to the number of corrosions. The surface treatment with HMDS was carried out by introducing the samples in a container filled with HMDS, so that the samples were reacted with HMDS in the form of gas.

While observing each sample in a visual field of 25 mm$^2$ with an optical microscope, the number of corrosions was visually counted.

No corrosions were observed in the visual fields of the samples which had been surface-treated for 5 and 10 minutes, respectively. It is therefore apparent that the surface treatment with HMDS restrained the aluminium alloy wirings from being corroded.

In the first embodiment above-mentioned, the description has been made of an application where a single-layer film of an aluminium alloy is used as the wiring material. However, similar effects can also be obtained with an application where a single-layer film comprising aluminium, or a multi-layer film comprising aluminium and refractory metal (titanium, titanium nitride, tungusten, titanium tungusten), is dry-etched with the use of chlorine-containing gas.

In the first embodiment, the surface treatment with HMDS is carried out with HMDS in the form of gas. However, similar effects can also be obtained by applying HMDS in the form of a liquid with a spin coater.

In the first embodiment, HMDS is used as the surface-active agent or its derivative, but there may also be used, instead of HMDS, a silane compound, a siloxane compound, a disilazine compound, a trisilazine compound, a piperazine compound, an amino germanium compound or a germanium halide compound.

(Second Embodiment)

The following description will discuss a second embodiment of the present invention with reference to FIGS. 4 (a) to (d).

In the second embodiment, aluminium alloy wirings 5 are used as the wiring metal. According to the second embodiment, the aluminium alloy wirings 5 are formed on the surface of a substrate 1 and then surface-treated with HMDS as a surface-active agent or its derivative, and photoresists 4 are then removed. In other words, the surface treatment with HMDS is carried out after the photoresists 4 are removed according to the first embodiment, while the surface treatment with HMDS is carried out before removing the photoresists 4 according to the second embodiment.

The following description will discuss the second embodiment, but the description in connection with FIGS. 4 (a) to (b) is here omitted because these figures are similar to FIGS. 1 (a) to (b) shown in connection with the first embodiment.

In a manner similar to that in the first embodiment, hydrophobic films 9 are formed on the surfaces of aluminium alloy wirings 5 and photoresists 4 with the use of HMDS, as shown in FIG. 4 (c).

As shown in FIG. 4 (d), the photoresists 4 are removed by oxygen plasma. Chlorine-containing substances 6 remaining on the surfaces of the aluminium alloy wirings 5 are coated with the hydrophobic films 9 and are therefore not reacted with water content in the air, thus preventing the aluminium alloy wirings 5 from being corroded.

Figure 5A:
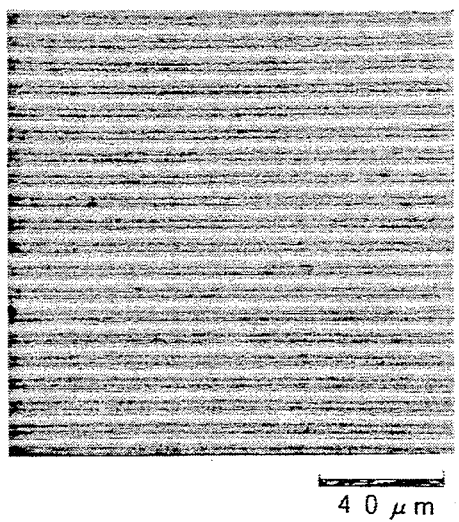
FIG. 5(a) shows pictures of a sample of aluminium alloy wirings for which a surface treatment with HMDS was carried out according to the method of the second embodiment.
Figure 5B:
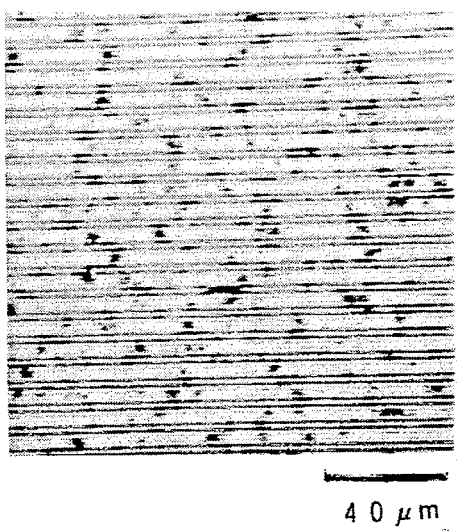
FIG. 5(b) shows a picture of a Sample of aluminum alloy wiring for which a surface treatment with HMDS was not carried out. These pictures were taken with an optical microscope for comparing the corrosion states of the samples with each other.

There were prepared two samples of aluminium alloy wirings, one of which was surface-treated with HMDS according to the method of the second embodiment, and the other of which was not surface-treated with HMDS. FIGS. 5(a) and 5(b) shows pictures of these samples taken with an optical microscope for comparing the corrosion states thereof with each other. Both pictures were taken of the samples in the state where substrates 1 were left in the air for 96 hours after the aluminium alloy wirings 5 had been formed by dry-etching aluminium alloy films 3 and before removing the photoresists 4. As shown in FIG. 5(a), no corrosions were observed on the sample which had been surface-treated with HMDS, while, as shown in FIG. 5(b), a number of corrosions were observed on the sample which had not been surface-treated with HMDS. It is therefore understood that the method of the second embodiment is also considerably effective in restraining the aluminium alloy wirings from being corroded.

Figure 6:
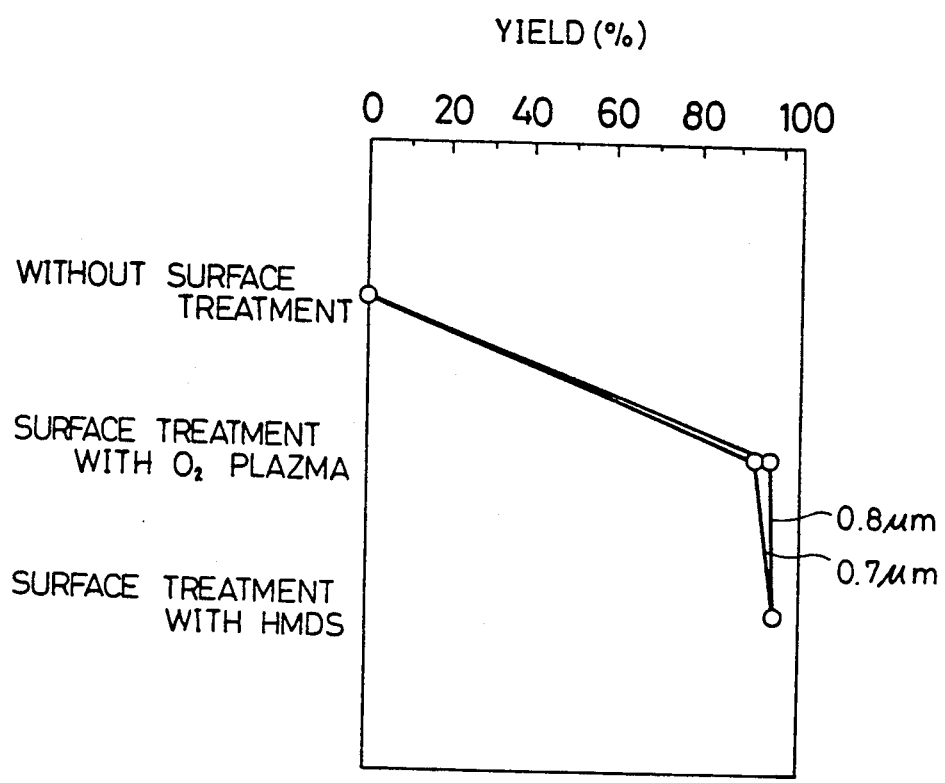
FIG. 6 is a view for comparing the yields of a sample of aluminium alloy wirings for which a surface treatment with HMDS was carried out according to the method of the second embodiment, and a sample of aluminium alloy wirings for which a surface treatment with HMDS was not carried out, such comparison being made after both samples have been left in the air for 96 hours after the metallic wirings had been formed.
Figure 7A:
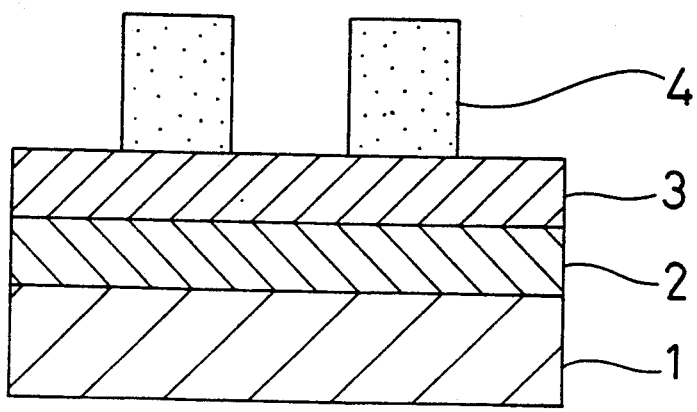
FIGS. 7 (a) to (c) are section views illustrating conventional steps of forming aluminium alloy wirings and treating the aluminium alloy wirings with oxygen plasma.
Figure 7B:
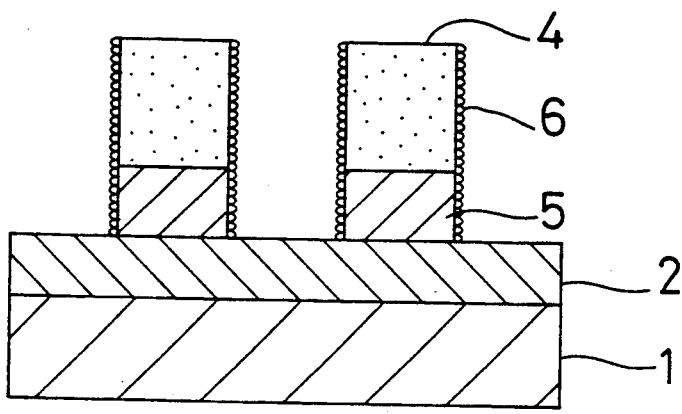
Figure 7C:
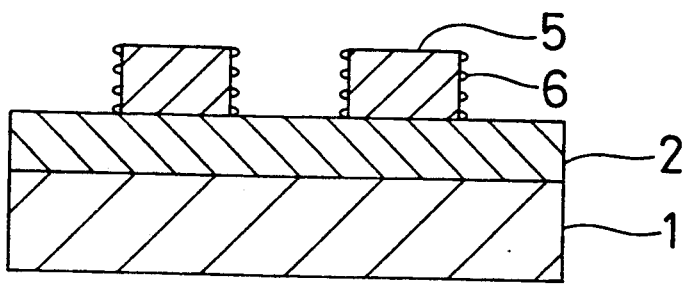

There were prepared aluminium alloy wirings each having a length of 19.8 m and a width of 0.7 μm and aluminium alloy wirings each having a length of 19.8 m and a width of 0.8 μm. Three different treatments were carried out on the aluminium alloy wirings thus prepared. After the aluminium alloy wirings were left in the air for 96 hours, the yields of aluminium alloy wirings were obtained. FIG. 6 shows the results of the yields thus obtained. The three different treatments include a surface treatment with HMDS, a surface treatment with oxygen plasma, and no treatment. Greater yield means less disconnection of the wirings due to corrosion. From FIG. 6, it is understood that the surface treatment with HMDS advantageously prevents the metallic wirings from being disconnected due to corrosion.

In the second embodiment above-mentioned, the description has been made of an application where a single-layer film of an aluminium alloy is used as the wiring material. However, similar effects can also be obtained with an application where a single-layer film comprising aluminium, or a multi-layer film comprising aluminium and refractory metal (titanium, titanium nitride, tungusten, titanium tungusten), is dry-etched with the use of chlorine-containing gas.

In the second embodiment, the surface treatment with HMDS is carried out with HMDS in the form of gas. However, similar effects can also be obtained by applying HMDS in the form of a liquid with a spin coater.

In the second embodiment, HMDS is used as the surface-active agent or its derivative, but there may also be used, instead of HMDS, a silane compound, a siloxane compound, a disilazine compound, a trisilazine compound, a piperazine compound, an amino germanium compound or a germanium halide compound.

What is claimed is:

1. A method of preventing the corrosion of metallic wirings comprising:
   a first step of forming a metallic film on a substrate;
   a second step of dry-etching said metallic film with chlorine-containing gas to form, in a desired pattern, metallic wirings made of said metallic film; and
   a third step of supplying a surface-active agent or its derivative to said metallic wirings to form hydrophobic molecular layers on the lateral walls of said metallic wirings.

2. A method of preventing the corrosion of metallic wirings according to claim 1, wherein the metallic film is a single-layer film mainly containing aluminium or a multi-layer film including a layer mainly containing aluminium and a layer made of other metal than aluminium.

3. A method of preventing the corrosion of metallic wirings according to claim 1, wherein the surface-active agent or its derivative contains silicon or germanium.

4. A method of preventing the corrosion of metallic wirings according to claim 3, wherein the surface-active agent or its derivative is selected from the group consisting of a silane compound, a siloxane compound, a disilazine compound, a trisilazine compound, a piperazine compound, an amino germanium compound and a germanium halide compound.

5. A method of preventing the corrosion of metallic wirings according to claim 1, wherein the surface-active agent or its derivative is a derivative of a surface-active agent which is reacted with functional groups present on the surfaces of the metallic wirings to form hydrophobic molecular layers on the lateral walls of said metallic wirings.

6. A method of preventing the corrosion of metallic wirings according to claim 1, wherein the third step is a step of supplying a surface-active agent or its derivative in the form of gas to the metallic wirings to form hydrophobic molecular layers on the lateral walls of said metallic wirings.

7. A method of preventing the corrosion of metallic wirings according to claim 1, wherein the second and third steps are carried out in the same apparatus under vacuum or in an atmosphere containing no water content.

8. A method of preventing the corrosion of metallic wirings according to claim 1, wherein the third step is a step of supplying a surface-active agent or its derivative in the form of a liquid to the metallic wirings to form hydrophobic molecular layers on the lateral walls of said metallic wirings.

9. A method of preventing the corrosion of metallic wirings according to claim 5, wherein the functional groups comprise $Al(OH)_3$, a hydroxyl group or $AlCl_3$.

* * * * *